(12) United States Patent
Nagai (10) Patent No.: US 7,800,210 B2
(45) Date of Patent: Sep. 21, 2010

(54) SEMICONDUCTOR DEVICE

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/857,082

(22) Filed: Sep. 18, 2007

(65) Prior Publication Data

US 2008/0006914 A1    Jan. 10, 2008

Related U.S. Application Data

(63) Continuation of application No. PCT/JP2005/005021, filed on Mar. 18, 2005.

(51) Int. Cl.
  *H01L 23/06*    (2006.01)
(52) U.S. Cl. .................. 257/684; 257/E23.069
(58) Field of Classification Search .......... 257/684
  See application file for complete search history.

(56) References Cited

U.S. PATENT DOCUMENTS

| | | | | |
|---|---|---|---|---|
| 6,469,373 | B2 * | 10/2002 | Funakura et al. | 257/679 |
| 7,061,103 | B2 * | 6/2006 | Chen et al. | 257/713 |
| 2002/0056906 | A1 * | 5/2002 | Kajiwara et al. | 257/697 |
| 2003/0020145 | A1 * | 1/2003 | Umezaki | 257/657 |
| 2004/0011557 | A1 * | 1/2004 | Combs et al. | 174/261 |

FOREIGN PATENT DOCUMENTS

| | | |
|---|---|---|
| JP | 61-241947 A | 10/1986 |
| JP | 06-020627 A | 1/1994 |
| JP | 07-045735 | 2/1995 |
| JP | 09-321213 A | 12/1997 |
| JP | 11-163002 | 6/1999 |
| JP | 11-297896 | 10/1999 |
| JP | 2001-060638 A | 3/2001 |
| JP | 2001-085458 | 3/2001 |
| JP | 2001-156095 | 6/2001 |
| JP | 2005-072587 A | 3/2005 |

OTHER PUBLICATIONS

Notification of Transmittal of Translation of the International Preliminary Report on Patentability (Form PCT/IB/338) of International Application No. PCT/JP2005/005021 mailed Sep. 27, 2007 with English translation Forms PCT/ISA/237.
International Search Report dated May 24, 2005 of PCT/JP2005/005021.

* cited by examiner

*Primary Examiner*—Thao X Le
*Assistant Examiner*—Elias Ullah
(74) *Attorney, Agent, or Firm*—Westerman, Hattori, Daniels & Adrian, LLP (57) ABSTRACT

It is an aspect of the embodiments discussed herein to provide a semiconductor device including: a substrate; a base on the substrate; an integrated circuit chip on the base; and a ball grid array type package material made of a resin and encapsulating the integrated circuit chip.

12 Claims, 11 Drawing Sheets

SEMICONDUCTOR DEVICE

TECHNICAL FIELD

The embodiments discussed herein are directed to a semiconductor device provided with a Ball Grid Array (BGA) package.

BACKGROUND ART

Recently, demands for reduction in size, in thickness and in weight of portable electronic equipment such as digital video cameras, digital portable phones, and laptop personal computers have been increased. In order to respond to these demands, about 70% reduction in size has been realized in three years in semiconductor devices such as a recent VLSI or the like. However, it cannot be said that this is a sufficient amount, and that improvement in the part packaging density on a packaged substrate is cited as an important problem. Accordingly, research and development into this problem have been conducted.

As a conventional semiconductor package, for example, a Through Hall Mount Device (THD) package and a Surface Mount Device (SMD) package have been adopted. In the through hall mount device package, mounting is performed by inserting a lead wire into a through hall provided to a printed board. As an example for it, a Dual Inline Package (DIP), a Pin Grid Array (PGA) and the like can be cited. In the surface mount type package, mounting is conducted by soldering a lead wire on the surface of the substrate. As this example, a Quad Flat Package (QFP), a Tape Carrier Package (TCP), a Ball Grid Array (BGA), a Chip Size Package (CSP), and the like can be cited.

Figure 9:
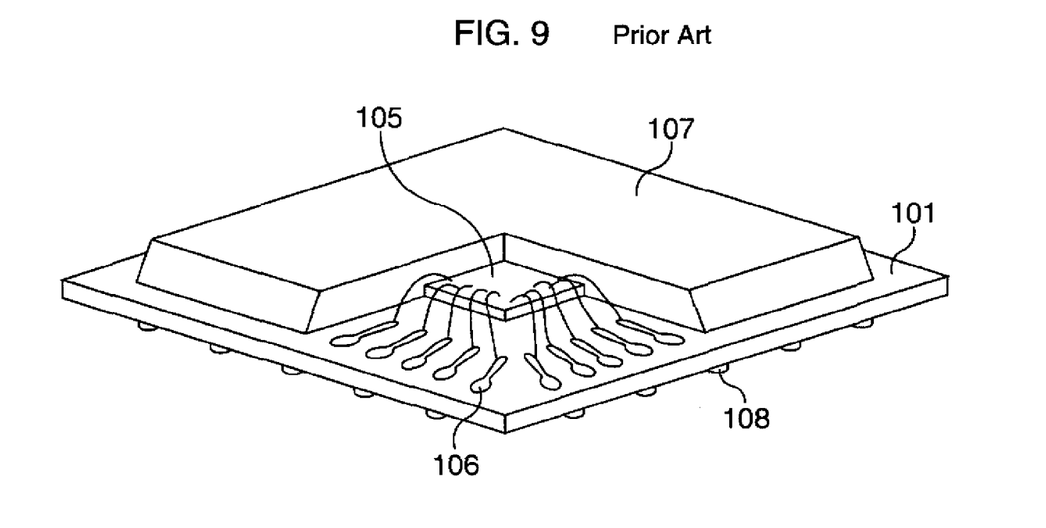
FIG. 9 is a perspective view showing a conventional BGA package.
Figure 10:
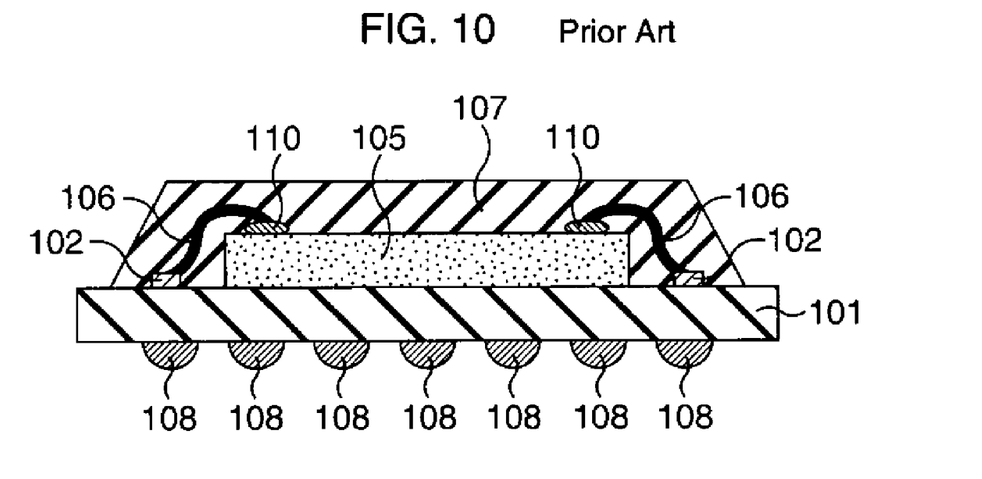
FIG. 10 is a cross sectional view showing the conventional BGA package.

As for the BGA or the CSP, a semiconductor integrated circuit (IC) chip is attached and fixed on one surface of a printed board. On the other surface of the printed board, a plurality of external connection terminals made of solder balls are attached. A plurality of electrodes of the IC chip are led-through to the external connection terminals. FIG. 9 is a perspective view showing a conventional BGA package, and FIG. 10 is a cross sectional view showing the conventional BGA package.

In the conventional BGA package, an IC chip (semiconductor integrated circuit) 105 is mounted on one surface of a printed board 101 for an interposer. As an insulating layer composing the printed board 101, a glass epoxy resin layer, a polyimide layer, or the like are used, for example. In addition, on the other surface of the printed board 101, a plurality of external connection terminals 108 made of solder balls are provided. Bonding wires 106 are connected to a plurality of electrodes 110 provided on the upper surface of the IC chip 105, and the other ends of the bonding wires 106 are connected to lands 102 provided to the printed board 101. A conductive layer (not shown) is provided in the printed board 101. The lands 102 are connected to the external connection terminals 108 via the conductive layer. Then, a package resin 107 to cover the IC chip 105 and so on is formed. Thus, a packaged semiconductor device is composed.

Figure 11:
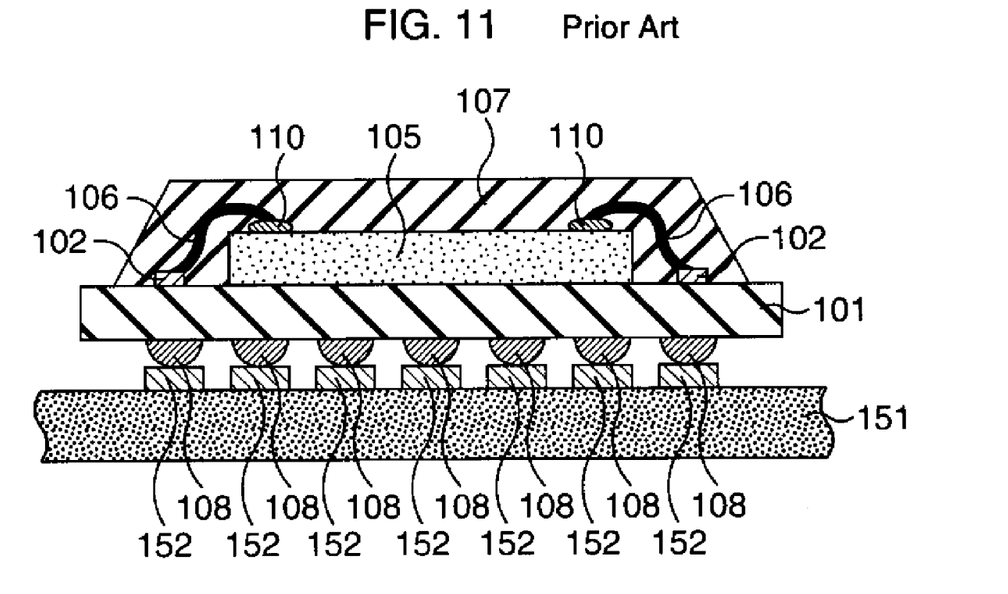
FIG. 11 is a cross sectional view showing a relation between the conventional BGA package and a mother printed board.

When the semiconductor device is installed on a mother printed board 151, as shown in FIG. 11, after each external connection terminal 108 of the semiconductor device is abutted on a printed board terminal 152 provided to the mother printed board 151, the lower portions of the respective external connection terminals 108 are melted and welded to the printed board terminals 152 by reflowing.

Figure 12:
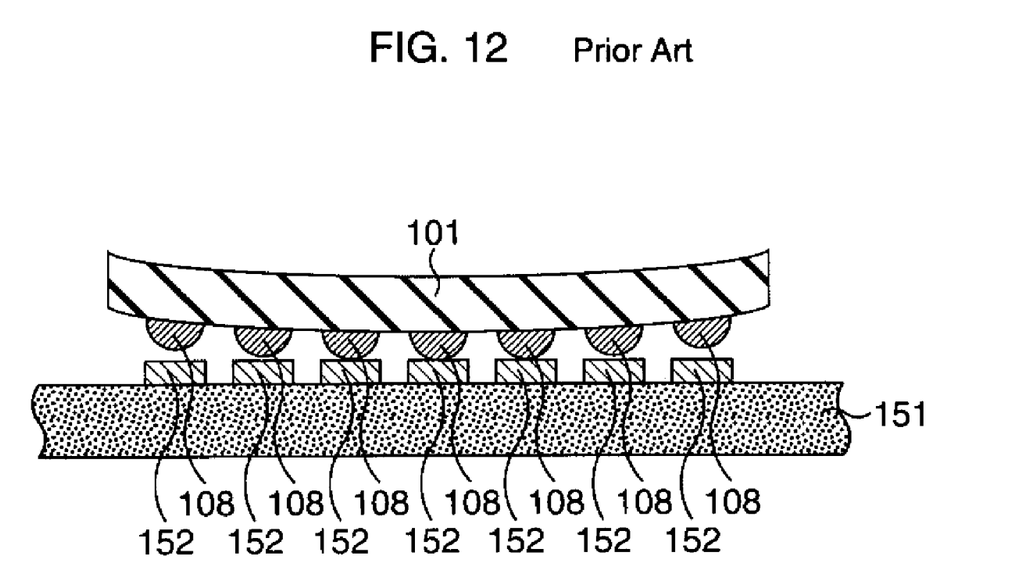
FIG. 12 is a cross sectional view showing a bend of a printed board 11.

When such an installation is performed, however, as shown in FIG. 12, the printed board 101 for the interposer sometimes bends backward due to the thermal stress caused by the reflowing. As a result, the IC chip 105 which is inside the semiconductor device also bends. When a piezoelectric device such as a ferroelectric capacitor or the like composing a ferroelectric memory is contained in the IC chip 105, since a compressive stress or a tensile stress is applied on the piezoelectric device, normal operations are impossible. In particular, when a ferroelectric memory is provided, data storage functions may be lost, data readout becomes disabled, or malfunctions may occur.

Furthermore, even in a chip which shows no problems at the time of reflowing, moisture may penetrate into the inside the IC chip with extended use. This results in expansion and distortion of the chip, and may cause malfunctions as described above.

Patent Document 1: Japanese Patent Application Laid-open No. 2001-60638

Patent Document 2: Japanese Patent Application Laid-open No. 2001-156095

Patent Document 3: Japanese Patent Application Laid-open No. 2001-85458

Patent Document 4: Japanese Patent Application Laid-open No. Hei 7-45735

SUMMARY

It is an aspect of the embodiments discussed herein to provide a semiconductor device including a substrate; a base on the substrate; an integrated circuit chip on the base; and a ball grid array type package material made of a resin and encapsulating the integrated circuit chip.

DETAILED DESCRIPTION OF THE PREFERRED EMBODIMENTS

As a result of earnest studies to solve the above-described problems, the present inventor has found that in a conventional BGA package, since a resin layer 107 exists only above an IC chip 105, variation of stress acting on the semiconductor device is large, which creates bending and distortion described above.

The present inventor has paid attention to such problems and has come up with various forms of the embodiment shown below.

Hereinafter, embodiments will be explained with reference to attached drawings.

First Embodiment

Figure 1A:
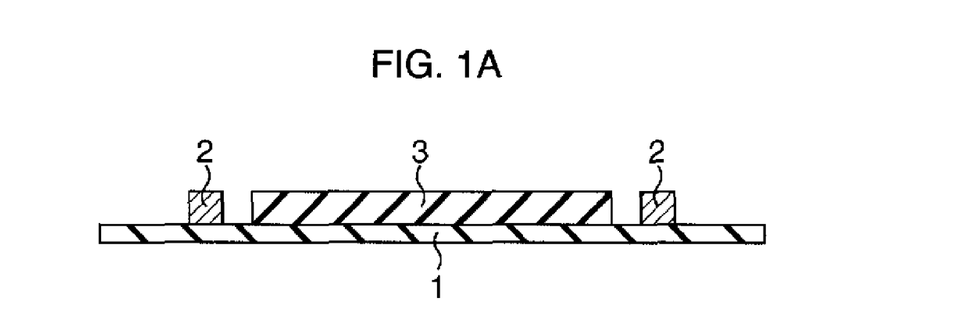
FIG. 1A is a cross sectional view showing a method for manufacturing a semiconductor device according to a first embodiment in process order.
Figure 1B:
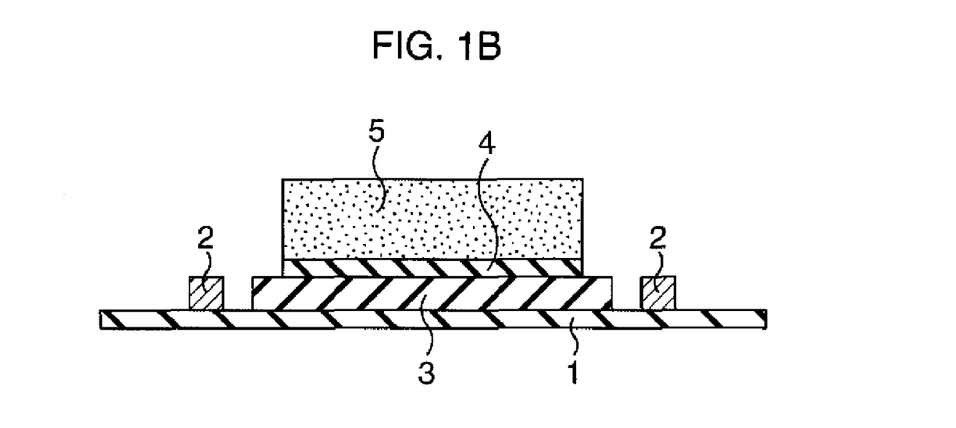
FIG. 1B is a cross sectional view showing a method for manufacturing a semiconductor device, following FIG. 1A in process order.
Figure 1C:
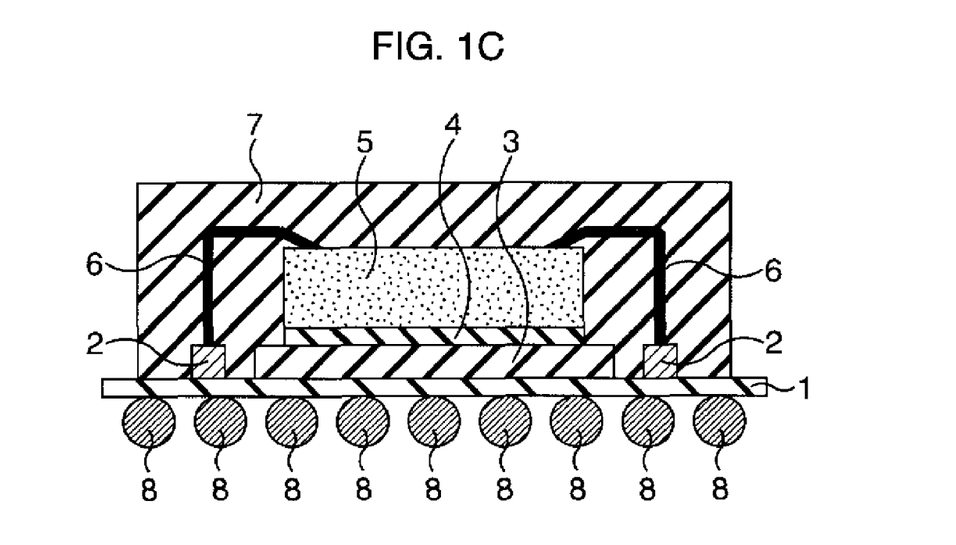
FIG. 1C is a cross sectional view showing a method for manufacturing a semiconductor device, following FIG. 1B in process order.
Figure 2:
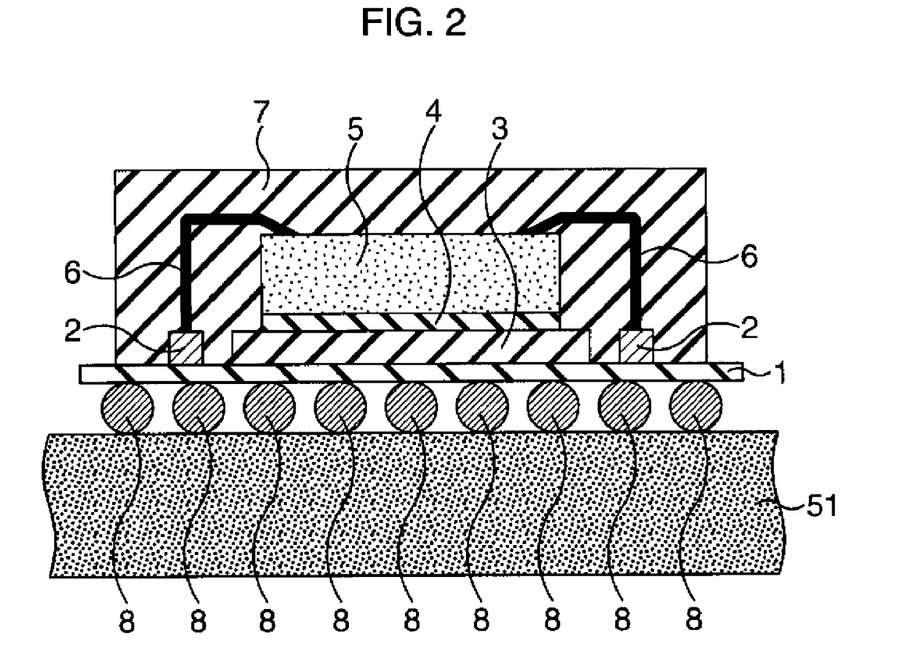
FIG. 2 is a cross sectional view showing the semiconductor device according to the first embodiment.

A first embodiment will be explained. A cross sectional structure of a semiconductor device will be explained here together with its method for manufacturing for convenience' sake. FIG. 1A to FIG. 1C are cross sectional views showing a method for manufacturing a semiconductor device according to the first embodiment, and FIG. 2 is a cross sectional view showing the semiconductor device according to the first embodiment.

In the first embodiment, as shown in FIG. 1A, a base 3 made of a resin is formed on a printed circuit board 1 on which lands 2 are provided. The height of the base 3 is about 100 μm to about 200 μm, for example. As the printed circuit board 1, for example, a glass epoxy substrate is usable.

Next, as shown in FIG. 1B, an adhesive 4 is applied to the base 3, and a semiconductor integrated circuit chip (IC chip) 5 is mounted thereon and fixed. A silver paste may be used instead of the adhesive 4. As the IC chip 5, for example, a chip provided with a ferroelectric memory is use. The height of the IC chip 5 is, for example, about 200 μm.

Next, as shown in FIG. 1C, terminals (not shown) provided to the IC chip 5 and the lands 2 are connected with bonding wires 6. Thereafter, the IC chip 5, the bonding wires 6, and so on are encapsulated with a package resin 7. The thickness of the package resin 7 with reference to the upper surface of the IC chip 5 is preferably 40 μm or more. Furthermore, it is preferable to use a material containing fillers as the package resin 7. Next, a number or the like to identify the IC chip 5 is marked on the upper surface of the package resin 7 using laser beams or the like. On the back face of the printed circuit board 1, solder balls 8, for example, are placed as external connection terminals. Thereafter, though not shown, dicing is conducted. Note that as a resin composing the base 3, a resin similar to the package resin 7 is used, for example. In this case, it is preferable to set the filler content of the resin composing the base 3 higher than that of the package resin 7.

As described above, a BGA package structured semiconductor device is completed. This semiconductor device is mounted above a mother printed board 51 and used, as shown in FIG. 2.

In the first embodiment, the base 3, whose material is similar to that of the package resin 7, exists below the IC chip 5. Accordingly, even when a stress is acting on the package resin 7 associated with moisture absorption and reflowing, the stress acts on the IC chip 5 substantially in a uniform fashion from the surroundings. Accordingly, even when a piezoelectric device such as a ferroelectric capacitor composing a ferroelectric memory is contained, malfunctions and the like never occur.

The filler content of the resin composing the base 3 is adjusted to be higher than that of the package resin 7 so that the amount of the moisture absorption is lower than that of the package resin 7. Accordingly, it becomes possible to relax the compression stress more.

Furthermore, in the present embodiment, since the thickness of the package resin 7 with reference to the upper surface of the IC chip 5 is set to be 40 μm or more, no damage extends to the IC chip 5 even when marking is conducted by a laser beam.

Second Embodiment

Figure 3:
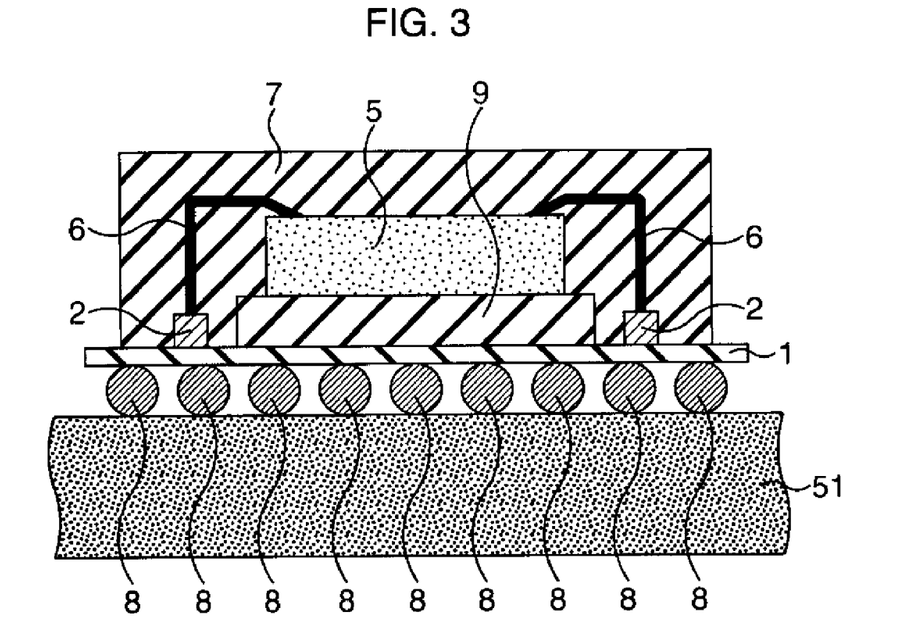
FIG. 3 is a cross sectional view showing a semiconductor device according to a second embodiment.

Next, a second embodiment will be explained next. FIG. 3 is a cross sectional view showing a semiconductor device according to the second embodiment.

In the second embodiment, a multi chip package (MCP) tape 9 is stuck on the printed circuit board 1, and the IC chip 5 is fixed thereon. The other points are structured similarly to those in the first embodiment.

In the second embodiment thus structured, the MCP tape 9 acts similarly to the base 3 in the first embodiment. As a result, the similar effects to those of the first embodiment can be obtained.

Third Embodiment

Figure 4:
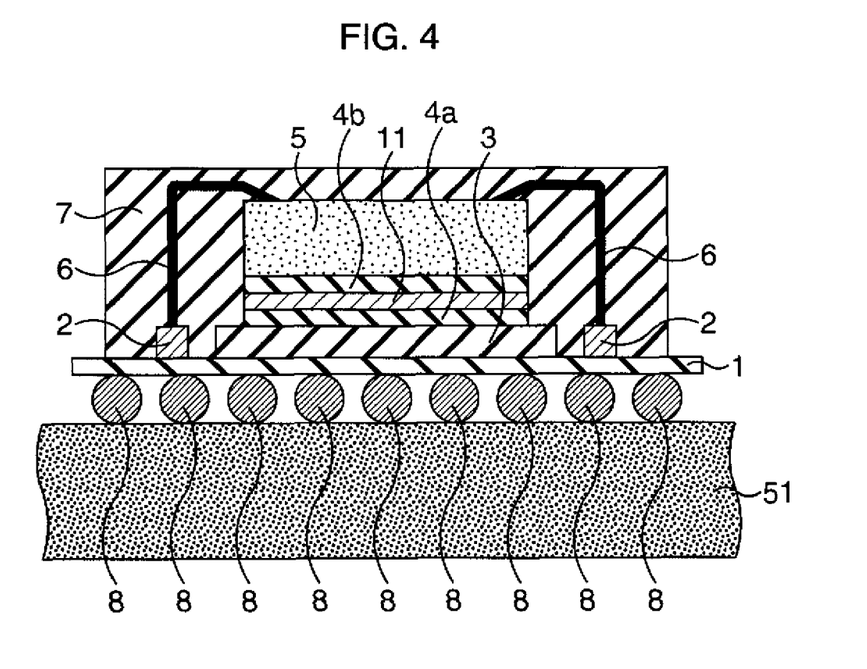
FIG. 4 is a cross sectional view showing a semiconductor device according to a third embodiment.

Next, a third embodiment will be explained. FIG. 4 is a cross sectional view showing a semiconductor device according to the third embodiment.

Figure 5:
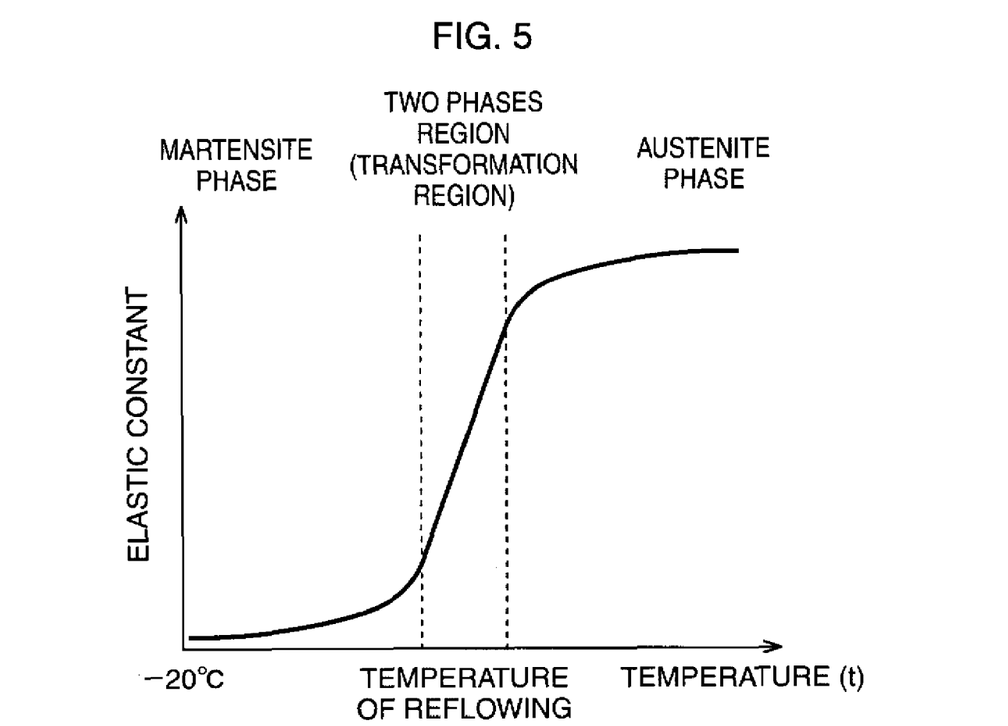
FIG. 5 is a graph showing temperature characteristics of an iron-manganese-silicon base stress inductive shape-memory alloy.

In the third embodiment, an adhesive 4a is applied to the base 3, and a metal plate 11 made of a shape-memory alloy is stuck thereon. In addition, an adhesive 4b is applied to the metal plate 11, and the IC chip 5 is mounted thereon and fixed. The shape-memory alloy composing the metal plate 11 is, for example, an iron-manganese-silicon (Fe—Mn—Si) base stress inductive shape-memory alloy, and has temperature characteristics as shown in FIG. 5. That is, this shape-memory alloy phase-transforms at a reflowing temperature of about 240° C. to about 270° C. as a boundary. Note that a silver paste or the like may be used instead of the adhesives 4a and 4b.

In the third embodiment thus structured, even when a thermal stress occurs at the time of reflowing, the metal plate 11 formed from the shape-memory alloy intends to restore to the original shape. Accordingly, stress does not act on the IC chip 5, and no malfunctions occur in the ferroelectric memory and the like.

Note that the base 3 is not necessarily provided but it is preferable that the base 3 is provided in order to obtain an integrated effect.

Fourth Embodiment

Figure 6:
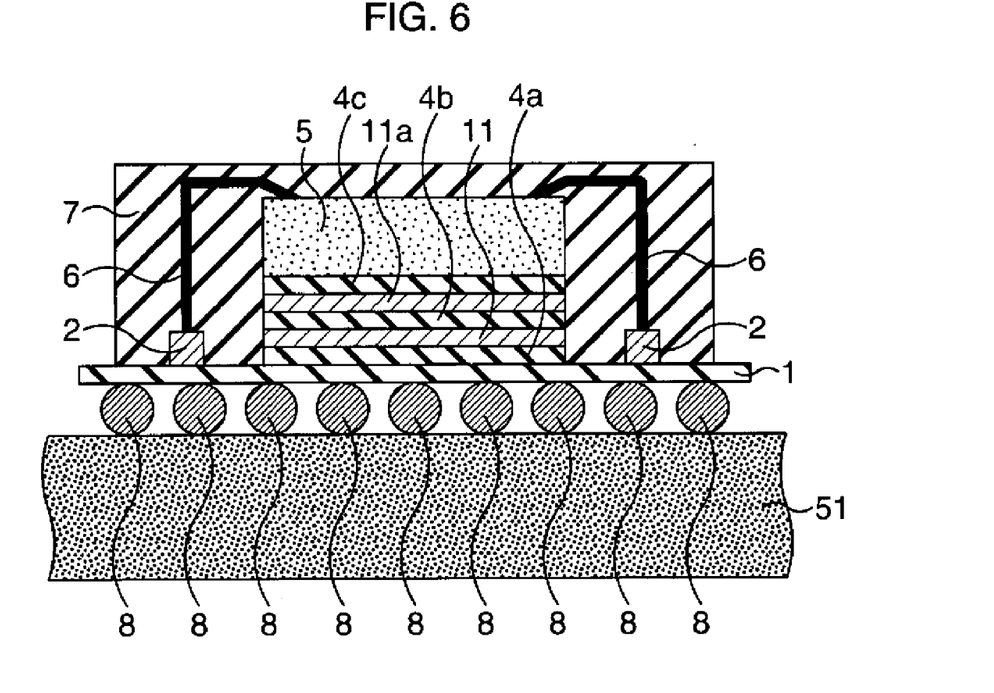
FIG. 6 is a cross sectional view showing a semiconductor device according to a fourth embodiment.

Next, a fourth embodiment will be explained. FIG. 6 is a cross sectional view showing a semiconductor device according to the fourth embodiment.

In the fourth embodiment, the adhesive 4a is applied to the printed circuit board 1 and the metal plate 11 made of the shape-memory alloy is stuck thereon. The adhesive 4b is further applied to the metal plate 11, and a metal plate 11a made of another shape-memory alloy is stuck thereon. An adhesive 4c is applied to the metal plate 11a, and the IC chip 5 is mounted thereon and fixed. Note that, as the shape-memory alloy composing the metal plate 11a, a material that phase-transforms at about 85° C. to about 100° C. as a boundary is used. Furthermore, a silver paste or the like may be used instead of the adhesives 4a to 4c.

In the fourth embodiment thus structured, effects similar to those in the third embodiment can be obtained owing to the function of the metal plate 11. Furthermore, since the metal plate 11a is provided, even when the temperature rises to about 85° C. to about 100° C. at the point of use, and thermal stress is generated in the package resin 7, this thermal stress is cancelled by a restoration force of the metal plate 11a. Accordingly, stress does not act on the IC chip 5 and no malfunctions occur in the ferroelectric memory and the like. The temperature about 85° C. to about 100° C. is, for example, a temperature to reach when the semiconductor device is installed on a car, for example.

Note that though the base 3 is not provided in the fourth embodiment, the base 3 may be provided between the printed circuit board 1 and the adhesive 4a.

Fifth Embodiment

Figure 7:
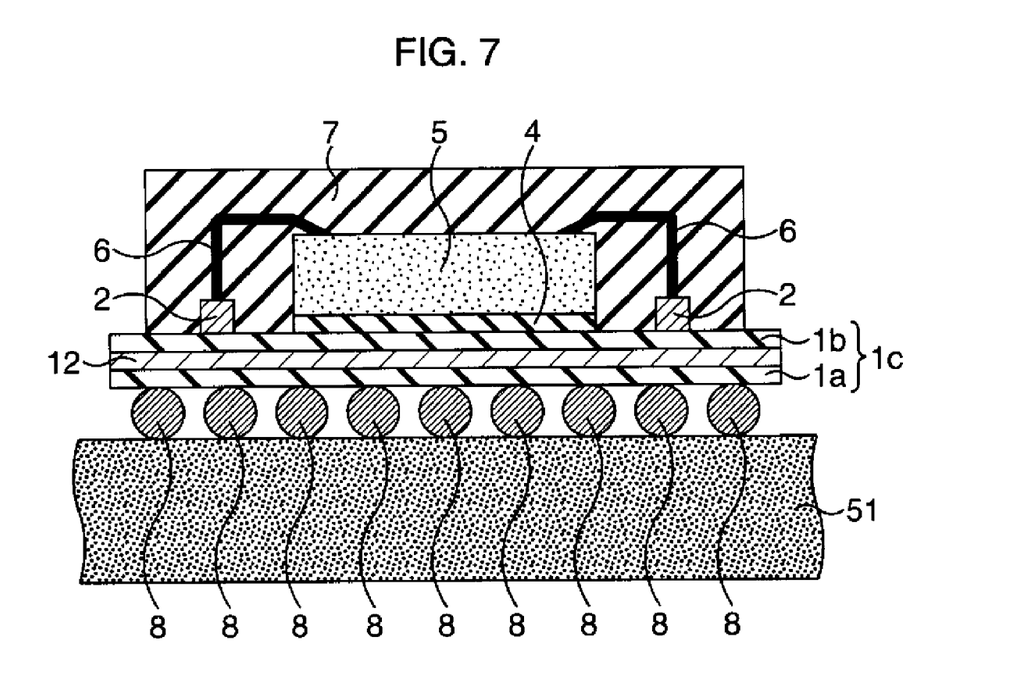
FIG. 7 is a cross sectional view showing a semiconductor device according to a fifth embodiment.

Next, a fifth embodiment will be explained. FIG. 7 is a cross sectional view showing a semiconductor device according to the fifth embodiment, and FIG. 8 is a cross sectional view showing a detail of a printed circuit board 1c in the fifth embodiment.

In the fifth embodiment, a printed circuit board 1c includes two sheets of glass epoxy substrates 1a and 1b, and a metal plate 12 sandwiched between them. The metal plate 12 is made of, for example, a shape-memory alloy that phase-transforms at about 150° C. to about 200° C. The IC chip 5 is fixed on the printed circuit board 1c with the adhesive 4. Note that the temperature about 150° C. to 200° C. is a temperature to cure the package resin 7.

Figure 8:
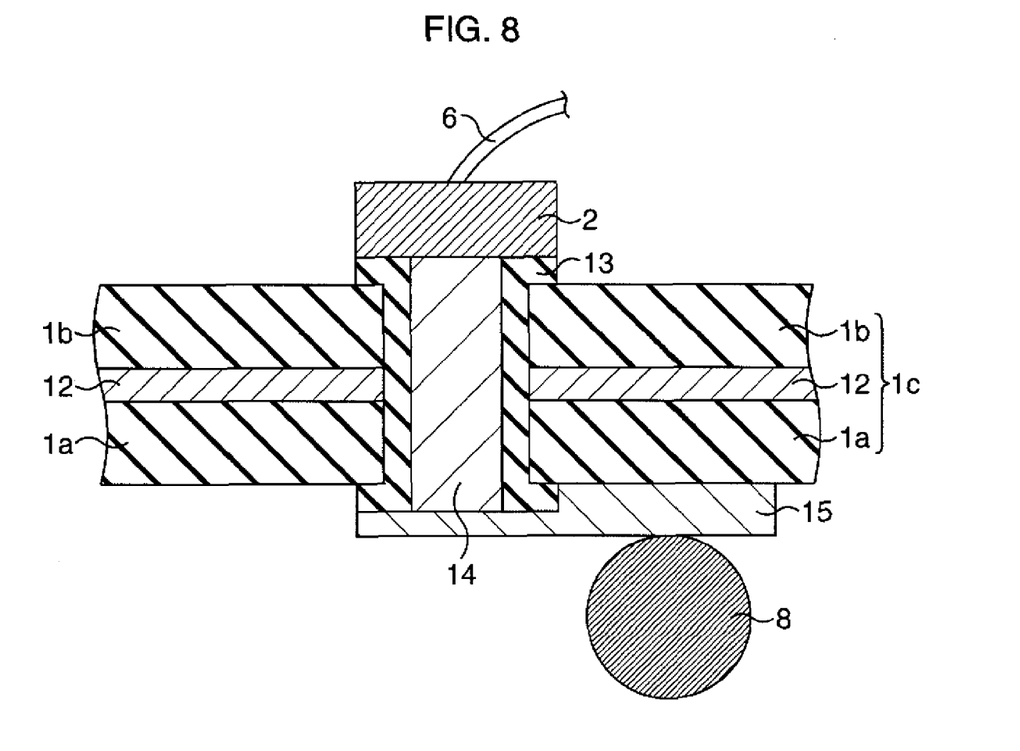
FIG. 8 is a cross sectional view showing a detail of a printed circuit board 1c in the fifth embodiment.

In the printed circuit board 1c, a plurality of through holes are formed, as shown in FIG. 8, an insulating film 13 is formed in the inside surface thereof, and a conductive material 14 is embedded in the inside thereof. The land 2 is formed on the conductive member 14, and the bonding wire 6 is connected to the land 2. On the back face side of the printed circuit board 1c, the conductive material 14 and the solder ball 8 are connected via a conductive layer 15.

In the fifth embodiment thus formed, thermal stress produced at the time of curing is cancelled by a restoration force of the metal plate 12. Accordingly, malfunctions accompanying the thermal stress can be prevented.

It should be noted that though the base 3 is not provided in the fifth embodiment, the base 3 may be provided between the printed circuit board 1c and the adhesive 4.

Note that the metal plate 12 may be smaller than the glass epoxy substrate 1b and 1c in planar view. In the event, a routed wiring, a through hole and so on may be formed on the outside of the metal plate 12.

Figure 13A:
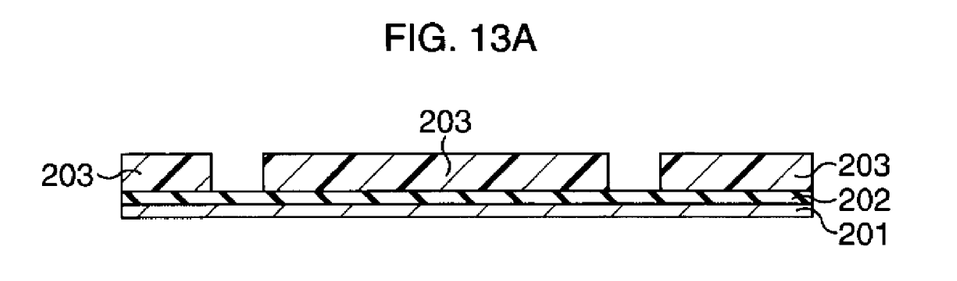
FIG. 13A is a cross sectional view showing a method for manufacturing a printed circuit board in process order.

Here, a method for manufacturing a printed circuit board suitable for the fifth embodiment will be explained. FIG. 13A to FIG. 13O are cross sectional views showing the method for manufacturing a printed circuit board.

First, as shown in FIG. 13A, a resist pattern 203 is formed on the surface of an insulating layer 202 side of a base material made by stacking a conductive layer 201 and the insulating layer 202 with each other.

Figure 13B:
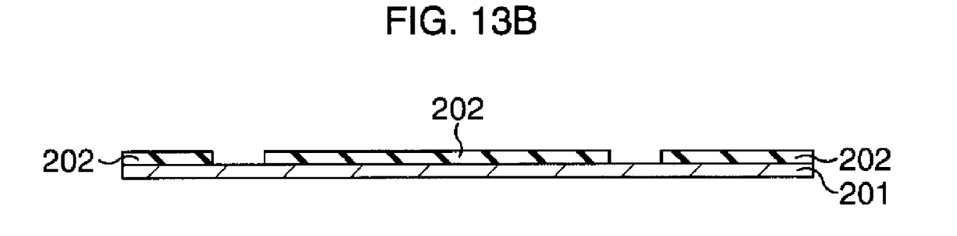
FIG. 13B is a cross sectional view showing the method for manufacturing the printed circuit board following FIG. 13A in process order.

Next, as shown in FIG. 13B, the insulating layer 202 is patterned using the resist pattern 203 as a mask. Then, the resist pattern 203 is removed.

Figure 13C:
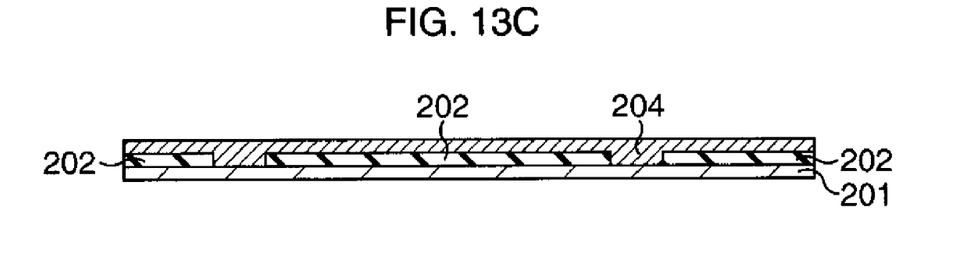
FIG. 13C is a cross sectional view showing the method for manufacturing the printed circuit board following FIG. 13B in process order.

Then, as shown in FIG. 13C, a conductive layer 204 is formed by, for example, a sputtering method on the insulating layer 202 and in the openings of the insulating layer 202.

Figure 13D:
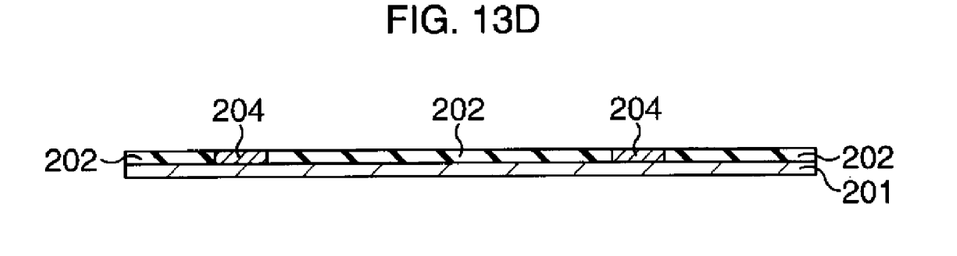
FIG. 13D is a cross sectional view showing the method for manufacturing the printed circuit board following FIG. 13C in process order.

Thereafter, as shown in FIG. 13D, flattening is conducted to the conductive layer 204 by an etch-back method or a CMP method.

Figure 13E:
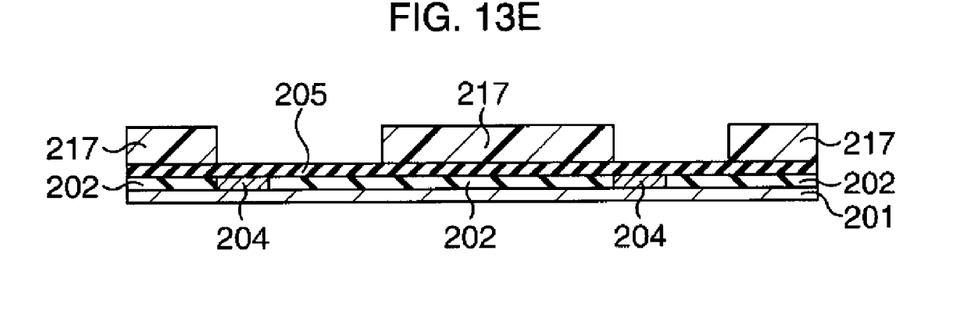
FIG. 13E is a cross sectional view showing the method for manufacturing the printed circuit board following FIG. 13D in process order.

Then, as shown in FIG. 13E, an insulating layer 205 is formed over the insulating layer 202 and the conductive layer 204. In addition, a resist pattern 217 is formed on the insulating layer 205.

Figure 13F:
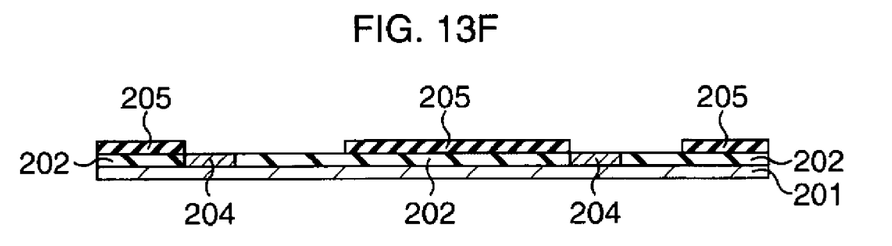
FIG. 13F is a cross sectional view showing the method for manufacturing the printed circuit board following FIG. 13E in process order.

Next, as shown in FIG. 13F, the insulating layer 205 is patterned using the resist pattern 217 as a mask. Then, the resist pattern 217 is removed.

Figure 13G:
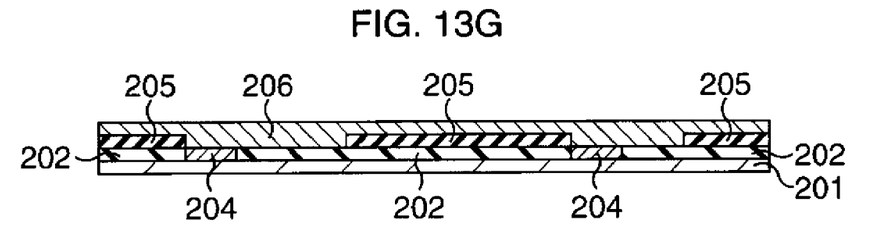
FIG. 13G is a cross sectional view showing the method for manufacturing the printed circuit board following FIG. 13F in process order.

Then, as shown in FIG. 13G, a conductive layer 206 is formed by, for example, a sputtering method on the insulating layer 205 and in the openings of the insulating layer 205.

Figure 13H:
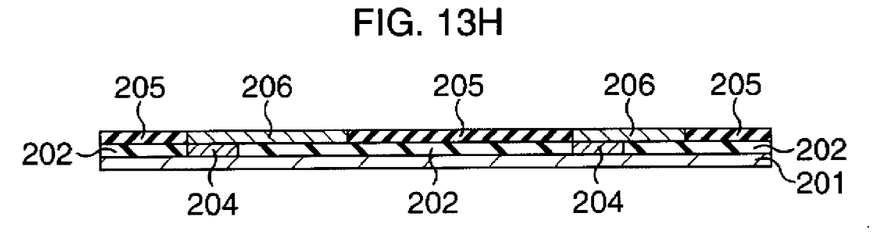
FIG. 13H is a cross sectional view showing the method for manufacturing the printed circuit board following FIG. 13G in process order.

Thereafter, as shown in FIG. 13H, flattening is conducted to the conductive layer 206 by an etch-back method or a CMP method.

Figure 13I:
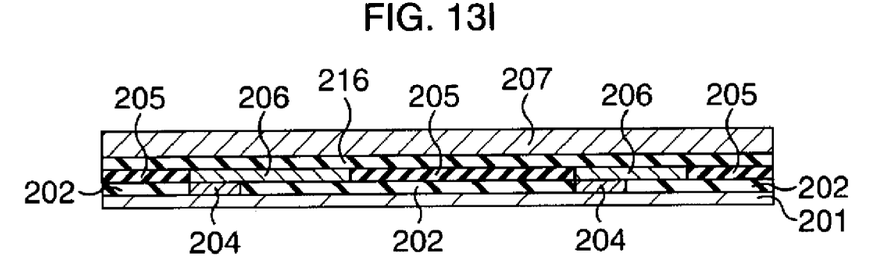
FIG. 13I is a cross sectional view showing the method for manufacturing the printed circuit board following FIG. 13H in process order.

Then, as shown in FIG. 13I, an insulating layer 216 and a shape-memory alloy film 207 are formed over the entire surface.

Figure 13J:
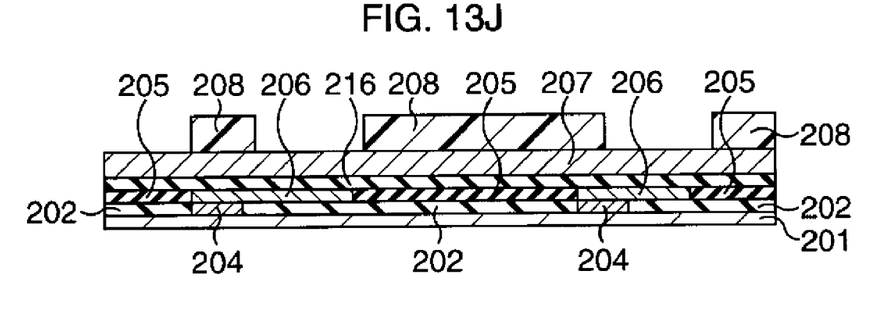
FIG. 13J is a cross sectional view showing the method for manufacturing the printed circuit board following FIG. 13I in process order.

Next, as shown in FIG. 13J, a resist pattern 208 is formed on the shape-memory alloy film 207.

Figure 13K:
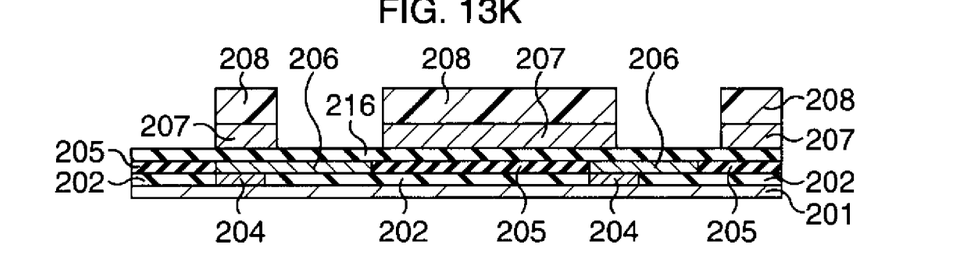
FIG. 13K is a cross sectional view showing the method for manufacturing the printed circuit board following FIG. 13J in process order.

Then, as shown in FIG. 13K, the shape-memory alloy film 207 is patterned using the resist pattern 208 as a mask.

Figure 13L:
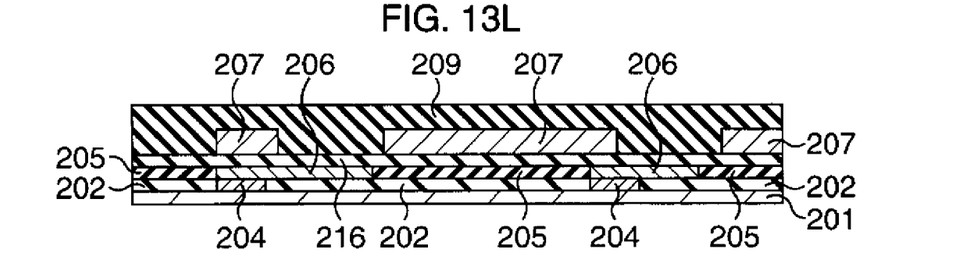
FIG. 13L is a cross sectional view showing the method for manufacturing the printed circuit board following FIG. 13K in process order.

Thereafter, as shown in FIG. 13L, the resist pattern 208 is removed. Then, an interlayer insulating film 209 is formed on the shape-memory alloy film 207 and in the openings of the shape-memory alloy film 207.

Figure 13M:
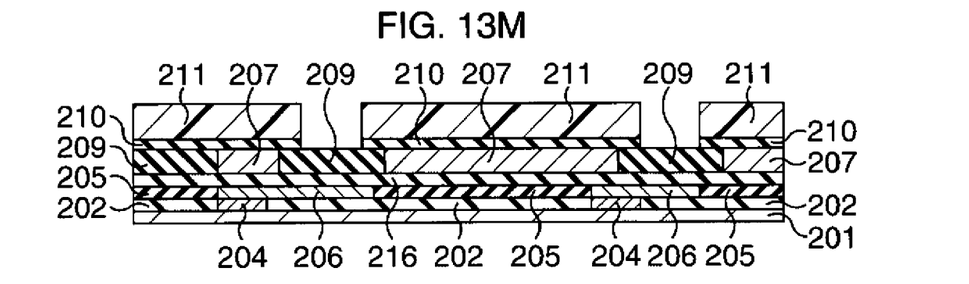
FIG. 13M is a cross sectional view showing the method for manufacturing the printed circuit board following FIG. 13L in process order.

Then, as shown in FIG. 13M, flattening is conducted to the interlayer insulating film 209 by an etch-back method or a CMP method. Then, an insulating layer 210 is formed over the entire surface and a resist pattern 211 is formed thereon. The insulating layer 210 is patterned using the resist pattern 211 as a mask.

Figure 13N:
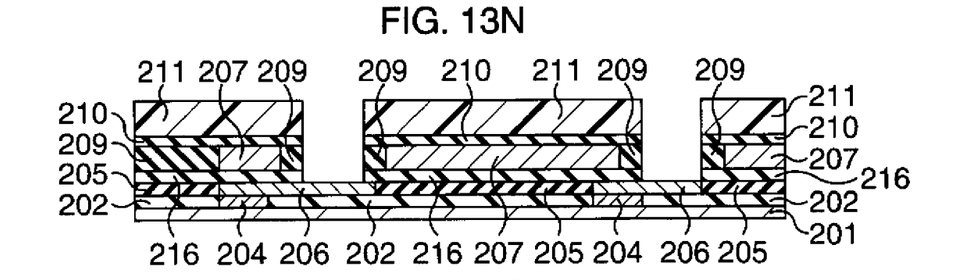
FIG. 13N is a cross sectional view showing the method for manufacturing the printed circuit board following FIG. 13M in process order.
Figure 13O:
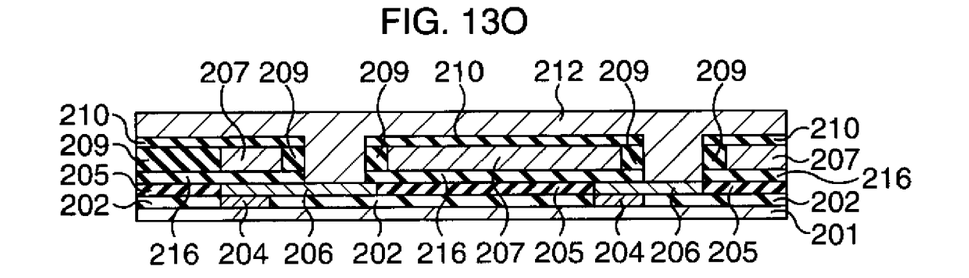
FIG. 13O is a cross sectional view showing the method for manufacturing the printed circuit board following FIG. 13N in process order.

Furthermore, as shown in FIG. 13N, the interlayer insulating film 209 and the insulating layer 216 are patterned using the resist pattern 211 as a mask. As a result, a portion of the insulating layer 206 is exposed.

Then, as shown in FIG. 13O, the resist pattern 211 is removed. Thereafter, a conductive layer 212 reaching the conductive layer 206 is formed over the whole surface. The conductive layer 212 may be formed by a sputtering method. In addition, it is also possible to form a W film as the conductive layer 212 and form a W plug from it.

Figure 14:
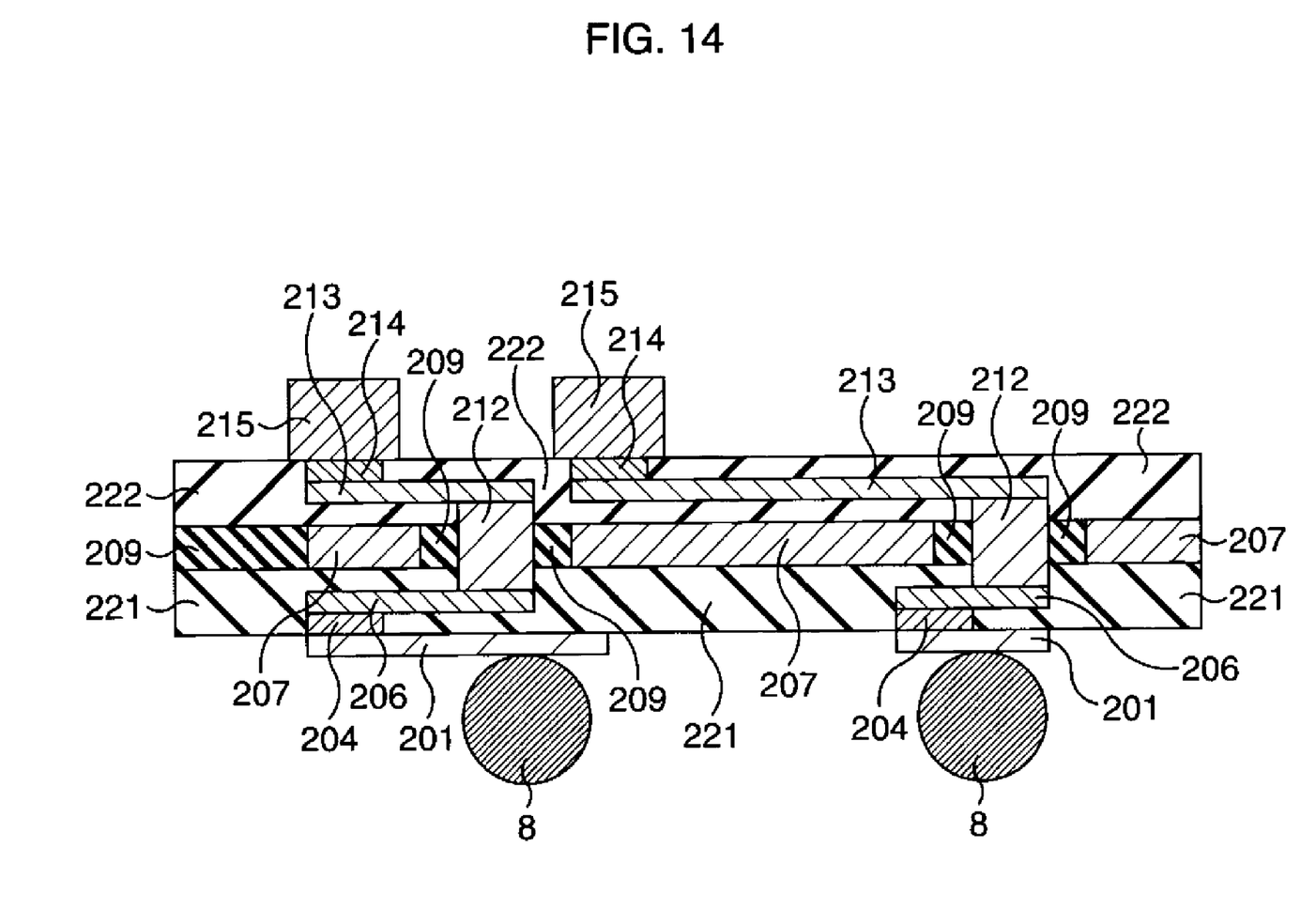
FIG. 14 is a view showing an example of a printed circuit board.

By repeating the formation and the patterning of a conductive layer and an insulating layer similar to those, the formation of a printed circuit board as shown in FIG. 14 is completed. In this printed circuit board, conductive layers 213 and 214 are connected to the conductive layer 212, and a land 215 is connected to the conductive layer 214. The conductive layer 201 is patterned, to which the solder ball 8 is connected. Insulating layers 221 and 222 are formed in the surroundings of routed wirings composed of these conductive layers.

Furthermore, it is possible to combine the respective embodiments with each other. For example, the fifth embodiment and each of the first to the fourth embodiments may be combined. In addition to that, a titanium-nickel (Ti—Ni) base alloy may be used instead of the iron-manganese-silicon base alloy as a shape-memory alloy.

It should be noted that provision of a shape memory member in a printed board is disclosed in Patent Document 1, but the temperature of its phase-transformation is not disclosed. Accordingly, it is not clear in what manner and how it functions.

In Patent Documents 2 and 3, formation of the bump unit with the shape-memory alloy is disclosed. In Patent Document 4, it is disclosed to use a shape-memory alloy for a part of the semiconductor device cap. However, neither of the thermal stresses at the time of reflowing and curing can be relaxed.

The order of embodiments does not has a particular meaning and has nothing to do with the importance of the embodiments.

INDUSTRIAL APPLICABILITY

As described above, according to the embodiment, even when thermal stresses and/or stresses accompanying moisture absorption may occur, these stresses are relaxed. Accordingly, even when a piezoelectric device such as a ferroelectric capacitor is provided in an integrated circuit chip, the possible malfunctions thereof can be avoided.

What is claimed is:

1. A semiconductor device, comprising:
a substrate;
a base made of a resin provided on said substrate;
an integrated circuit chip provided on said base; and
a ball grid array type package material made of a resin encapsulating said integrated circuit chip,
wherein said resin comprising said base and said resin comprising said package material contain fillers,
wherein a filler content of said resin composing said base is higher than a filler content of said resin composing said package resin,
wherein an entire bottom surface of the integrated circuit chip is adhered to a surface of the base via an adhesive.

2. The semiconductor device according to claim 1, wherein said base and package material are composed of a same resin as each other.

3. The semiconductor device according to claim 1, wherein a thickness of said package material is 40 µm or above with reference to an upper surface of said integrated circuit chip.

4. The semiconductor device according to claim 1, wherein a thickness of said base is 100 µm to 200 µm.

5. The semiconductor device according to claim 1, wherein said base is composed of a multi-chip package tape.

6. A semiconductor device, comprising:
a substrate;
a metal plate made of a shape-memory alloy provided on said substrate;
an integrated circuit chip provided on said metal plate; and
a ball grid array type package material made of a resin encapsulating said integrated circuit chip,
wherein said resin comprising said base and said resin comprising said package material contain fillers,
wherein a filler content of said resin composing said base is higher than a filler content of said resin composing said package resin,
wherein an entire bottom surface of the integrated circuit chip is adhered to a surface of the base via an adhesive.

7. The semiconductor device according to claim 6, wherein said shape-memory alloy phase-transforms at 240° C. to 270° C.

8. The semiconductor device according to claim 6, further comprising a second metal plate provided between said substrate and said integrated circuit chip, said second metal plate being composed of a shape-memory alloy that phase-transforms at a temperature different from said shape-memory alloy composing said metal plate.

9. The semiconductor device according to claim 8, wherein said shape-memory alloy composing said second metal plate phase-transforms at 80° C. to 100° C.

10. A semiconductor device, comprising:
a substrate;
an integrated circuit chip provided on said substrate;
a ball grid array type package material made of a resin encapsulating said integrated circuit chip,
wherein said substrate comprises:
first and second insulating plates; and
a metal plate sandwiched between said first and second insulating plates, and made of a shape-memory alloy whose phase-transformation temperature is 150° C. to 200° C.,
wherein said resin comprising said base and said resin comprising said package material contain fillers,
wherein a filler content of said resin composing said base is higher than a filler content of said resin composing said package resin,
wherein an entire bottom surface of the integrated circuit chip is adhered to a surface of the base via an adhesive.

11. The semiconductor device according to claim 10, further comprising a base made of a resin provided between said substrate and said integrated circuit chip.

12. The semiconductor device according to claim 10, wherein said metal plate is smaller than said first and second insulating plates in planar view.

* * * * *